(12) United States Patent
Giroud et al.

(10) Patent No.: US 9,783,407 B2
(45) Date of Patent: Oct. 10, 2017

(54) METHOD FOR MAKING A SUSPENDED MEMBRANE STRUCTURE WITH BURIED ELECTRODE

(75) Inventors: Sophie Giroud, Saint Egreve (FR); Audrey Berthelot, Saint Ismier (FR); Vincent Larrey, La Murette (FR); Jean-Philippe Polizzi, Grenoble (FR); Marie-Hélène Vaudaine, Seyssins (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/546,411

(22) Filed: Jul. 11, 2012

(65) Prior Publication Data

US 2013/0181302 A1 Jul. 18, 2013

(30) Foreign Application Priority Data

Jul. 12, 2011 (FR) ...................................... 11 56353

(51) Int. Cl.
*B81B 3/00* (2006.01)
*B81C 1/00* (2006.01)

(52) U.S. Cl.
CPC ............ *B81B 3/00* (2013.01); *B81C 1/00015* (2013.01); *B81C 1/00095* (2013.01); *B81C 1/00166* (2013.01); *B81B 2203/04* (2013.01); *B81B 2207/07* (2013.01)

(58) Field of Classification Search
None
See application file for complete search history.

(56) References Cited

U.S. PATENT DOCUMENTS

| 6,761,068 | B1 | 7/2004 | Schmid |
| 7,083,997 | B2 | 8/2006 | Brosnihhan et al. |
| 7,578,189 | B1* | 8/2009 | Mehregany ................ 73/514.18 |
| 7,950,288 | B2 | 5/2011 | Fujii et al. |
| 2002/0117728 | A1* | 8/2002 | Brosnihhan et al. ......... 257/446 |
| 2003/0001221 | A1 | 1/2003 | Fischer et al. |
| 2006/0208326 | A1 | 9/2006 | Nasiri et al. |

(Continued)

FOREIGN PATENT DOCUMENTS

FR 2 932 789 A1 12/2009
JP 2010071964 4/2010

(Continued)

OTHER PUBLICATIONS

Definition of "Electrode" from [https://www.merriam-webster.com/dictionary/electrodes] on Dec. 20, 2016.*

(Continued)

*Primary Examiner* — Jay C Chang
(74) *Attorney, Agent, or Firm* — Oblon, McClelland, Maier & Neustadt, L.L.P.

(57) ABSTRACT

A microsystem and/or nanosystem type device is disclosed, comprising:
  a first substrate, or intermediate substrate, comprising a mobile part,
  a second substrate or support substrate,
  at least one lower electrode, and one dielectric layer (101) located between the first and second substrates, the dielectric layer being arranged between the lower electrode and the first substrate;
  the first substrate comprising through vias filled with conducting material in contact with said lower electrode.

16 Claims, 9 Drawing Sheets

(56) References Cited

U.S. PATENT DOCUMENTS

| | | | |
|---|---|---|---|
| 2007/0048888 A1* | 3/2007 | Christenson | B81B 7/0006 438/48 |
| 2007/0090474 A1 | 4/2007 | Li et al. | |
| 2007/0113661 A1 | 5/2007 | Benzel et al. | |
| 2008/0030205 A1 | 2/2008 | Fujii et al. | |
| 2008/0176046 A1 | 7/2008 | Yamaguchi et al. | |
| 2009/0134513 A1* | 5/2009 | Qiu | 257/734 |
| 2009/0229370 A1 | 9/2009 | Fujii et al. | |
| 2009/0321887 A1 | 12/2009 | Larrey et al. | |
| 2010/0058865 A1* | 3/2010 | Zhang et al. | 73/514.38 |
| 2010/0193884 A1 | 8/2010 | Park et al. | |
| 2011/0079632 A1* | 4/2011 | Chey et al. | 228/260 |
| 2012/0001277 A1 | 1/2012 | Park et al. | |
| 2014/0357006 A1 | 12/2014 | Ben Mbarek et al. | |

FOREIGN PATENT DOCUMENTS

| | | |
|---|---|---|
| WO | WO 2007/135878 A1 | 11/2007 |
| WO | WO 2010/081603 A1 | 7/2010 |

OTHER PUBLICATIONS

U.S. Appl. No. 13/546,751, filed Jul. 11, 2012, Berthelot, et al.
U.S. Appl. No. 14/707,216, filed May 8, 2015, Berthelot.
French Preliminary Search Report issued Mar. 1, 2012, in Patent Application No. 1156353 (with English Translation of Category of Cited Documents).
French Preliminary Search Report issued Jan. 24, 2012, in Patent Application No. 1156351 (with English Translation of Category of Cited Documents).
T. Yamamoto, et al., "Capacitive Accelerometer with High Aspect Ratio single crystalline Silicon Microstructure Using the SOI Structure with Polysilicon-Based Interconnect technique", Proceedings of the IEEE 13$^{th}$ Annual International Conference on Micro Electro Mechanical Systems MEMS, XP 001045369, Jan. 23, 2000, pp. 514-519.
Anu Kärkkäinen, et al., "Optimized Design and Process for Making a DC Voltage Reference Based on MEMS", IEEE Transactions on Instrumentation and Measurement, vol. 54, No. 2, XP 011128181, Apr. 2005, pp. 563-566.
Andreas Plößl, et al., "Wafer direct bonding: tailoring adhesion between brittle materials", Materials Science and Engineering, vol. R25, No. 1-2, XP 004167445, Mar. 10, 1999, pp. 1-88.
Yogesh B. Gianchandani, et al., "Impact of Long, High Temperature Anneals on Residual Stress in Polysilicon", Transducers, IEEE International Conference on Solid-State Sensors and Actuators, Jun. 16-19, 1997, pp. 623-624.
Q. -Y. Tong, "Principles of wafer bonding", INSPEC, Chapter 1, 2002, pp. 1-20.
1$^{st}$ Notification of Reasons for Refusal issued in corresponding Japanese Patent Application No. 2012-155324 mailed May 10, 2016 (w/English translation).

* cited by examiner

METHOD FOR MAKING A SUSPENDED MEMBRANE STRUCTURE WITH BURIED ELECTRODE

TECHNICAL FIELD AND PRIOR ART

The invention relates to the field of semiconductors and more particularly microsystems and/or nanosystems and particularly MEMS/NEMS and their collective manufacturing on a substrate.

It is particularly applicable to the case in which fabrication of the MEMS/NEMS component requires at least one set of electrodes under the NEMS or MEMS mobile structure, and in which an electrical connection has to be made between two electrodes located on each side of this mobile structure.

MEMS have a wide range of applications such as accelerometers, gyrometers, microoptic components and components for optical communications. They are used to integrate mechanical and electronic elements on the same substrate.

An MEMS is fabricated starting from a substrate comprising a sacrificial layer formed in a first substrate. Fabrication of this substrate may be derived from SOI technologies or more simply made by the deposition of the sacrificial layer and then formation of the active layer on said sacrificial layer. Starting from the substrate thus created, deep trenches are etched that will define the MEMS component. For example, in the case of an accelerometer operating on a capacitive detection and activation principle, vertical electrodes commonly called combs will be defined together with a suspended seismic mass called the membrane and connected to these combs. This structure is then made mobile by eliminating the sacrificial layer under the MEMS parts to be put into movement.

Some MEMS like gyrometers or micro-mirrors are sensitive to movements outside the plane of the substrate on which they are constructed. Therefore, they need at least one set of electrodes located above/below the mobile elements as can be seen in document U.S. Pat. No. 7,083,997 or document US 2010/0193884.

One of the difficulties of components with lower electrodes lies in the connection of these electrodes to the remainder of the MEMS actuation electronics.

A solution has been provided in document US 2010/0193884. Contact between the lower and upper electrodes is made by two metallic cementing operations, a first between the lower substrate called the support and the active layer, and a second between the active layer and the upper substrate called the cap that supports the upper electrode. One of the limitations of this method lies in the first metallic cementing operation.

The materials used for this cementing operation cannot be subject to high temperatures. Cementing makes it impossible to use so-called hot processes such as thermal oxidation processes in the remaining part of the fabrication of the component.

U.S. Pat. No. 7,083,997 discloses a method of making contact by deep etching of vias through the active layer and then through the sacrificial layer to finally reach the conducting layer that will be used as the lower electrode. This technique is expensive, difficult to implement and to control in the case of MEMS with a high aspect ratio, which causes component reliability defects.

A third solution is proposed in the document "*Capacitive Accelerometer with High Aspect ratio single crystalline Silicon Microstructure using the SOI structure with polysilicon-based interconnect technique*, T. Yamamoto & al, *Proceedings IEEE, Thirteenth Annual International Conference on MEMS,* 2000". These authors directly bring the set of lower electrodes and the active layer of the MEMS into contact through the lower face of the MEMS. They then use the active layer as an interconnection to bring the contact of the lower electrode to the surface of the MEMS. This interconnection is then defined and isolated from the remaining part of the MEMS structure by etching isolation trenches in the active layer. One of the limitations of this method lies in the choice of material for the active layer. Considering that this layer, among other functions, performs an interconnection function, it must have some conductivity which reduces the choice of materials that can be used and possible applications of the disclosed fabrication method. MEMS requiring active layers with no or little conductivity cannot be fabricated using this method. Furthermore, this method makes it necessary to make isolation trenches.

Therefore the technique described in the document written by T. Yamamoto et al. has disadvantages and particularly the obligation to have a conducting active layer to act as an interconnection between the lower electrodes and the surface of the MEMS.

Furthermore, during fabrication of these components with a set of lower electrodes, it is preferable that these lower electrodes are aligned with the MEMS structure itself or with a set of upper electrodes. This alignment is usually made by using alignment marks generated on the lower face of the support substrate. These marks are used both as alignment marks during assembly of the support substrate with the active layer as described in document US 2010/0193884, and alignment with the technological levels made after this assembly as is also described in document U.S. Pat. No. 7,083,997. They require the production of specific technological steps and the use of special alignment equipment between the front face and the back face of a substrate (or substrate assembly equipment) which results in a cost on the industrial component.

The article by T. Yamamoto & al. mentioned above divulges the creation of an etched trench full of oxide. When the active layer is thinned, the marks previously created in said active layer are exposed which enables a direct realignment through the upper surface of the MEMS.

This method has the advantage that it does not use any special front face/back face alignment equipment but it does require special steps to be carried out to make these marks.

PRESENTATION OF THE INVENTION

A microsystem and/or nanosystem type device, for example a MEMS and/or NEMS comprises:
- a first substrate or intermediate substrate, comprising a mobile part,
- a second substrate or support substrate,
- at least one lower electrode and one dielectric layer located between the first and second substrates, the dielectric layer being arranged in part or in whole between the lower electrode and the first substrate;
- the first substrate comprises through vias filled with conducting material in contact with said lower electrode.

Such a device may also comprise an upper electrode in electrical contact with the vias passing through the first substrate. This upper electrode may be made either directly on the first substrate, or it may be transferred onto the first substrate through a third substrate.

The lower electrode and the upper electrode enable detection of movement of the mobile part outside the plane of the layers by capacitive variation. However for a capacitive detection, a single electrode may be sufficient although the use of a second electrode would make it possible to make detection with better sensitivity.

The conductivity of the active layer is not imposed and it may be arbitrary, because the interconnection is made using through vias filled with a conducting material, and not the first substrate itself.

Thus, a wide variety of active layers and substrates can be used, which makes the invention applicable to many types of MEMS.

The upper electrode may be assembled with the intermediate substrate using conducting means, or it may be supported by a 3rd substrate.

Such a device may also comprise electrical contact zones between the lower electrode and the first substrate.

The first substrate may be made of a semiconducting, monocrystalline material, for example silicon, or SiGe or SiC or SiGeC or GaAs or Ge or a semiconducting material in Group III-V, preferably doped, or a "silicon on insulator" (SOI) type substrate. As a variant, the first substrate comprises several layers stacked on a substrate.

The second substrate is usually a support substrate such as a bulk substrate or a composite substrate like the first substrate, in order to perform other functions. Moreover, this second substrate may comprise a dielectric layer on the surface (usually oxide).

A dielectric layer may be made between the second substrate and the lower electrode layer.

Etched zones may be defined in the lower electrode layer and in the dielectric layer located between the second substrate and the lower electrode layer.

Etched zones may be defined in the lower electrode layer, these etched zones being filled with the material of the dielectric layer.

A method for making a microsystem and/or nanosystem type device, for example a MEMS and/or NEMS type device and particularly a device like that described above, comprises:

a) formation on a first substrate of at least one first dielectric layer, at least one lower electrode defined in a lower electrode layer, and connection means passing at least partly through the first substrate, so as to come into contact with said lower electrode;

b) then, after step a), the assembly of the first substrate with a second substrate, such that the lower electrode layer and the first dielectric layer are located between the first and the second substrate, this dielectric layer being located between the lower electrode and the first substrate;

c) then, after step b), the production of a mobile part in the first substrate facing the lower electrode, and release of this mobile part by elimination of at least part of the first dielectric layer located under the mobile part.

This method can produce an electrode and make its interconnection through the active layer of the MEMS, during a single step b).

It can solve problems related to making contact through an active layer of the MEMS, particularly if there is a high aspect ratio, and thus increase the reliability of the component produced.

The aspect ratio is defined as being the ratio between the thickness of the active part and the smallest lateral dimension of the component, for example the air gap or comb dimensions for an accelerometer. Large aspect ratios mean a factor of at least 5, and preferably at least 10, between these dimensions.

This method may also comprise formation of an upper electrode on the first substrate, in electrical contact with the through connection means. This upper electrode may be formed on the first substrate or it may be transferred onto the first substrate through a third substrate.

Therefore, this method can be used to make a connection between the electrodes located on each side of a MEMS device using technologies used in the semiconducting industry, without any restrictions on the materials or the process temperatures.

In particular, according to one embodiment, step c) may be made by etching patterns through the first substrate, filling these patterns by a sacrificial material, the upper electrode is then formed and the sacrificial material and the first dielectric layer are at least partially etched.

Filling these etched patterns by the sacrificial layer provides a means of depositing the second electrode in a plane manner.

According to one embodiment, step c) is once again done by etching patterns through the first substrate; conducting pads are formed on the first substrate before step c), and the upper electrode is then formed in contact with these conducting pads after step c).

The formation of conducting pads may comprise:
deposition of a layer of sacrificial material on the first substrate,
then etching this layer of sacrificial material to define etched zones facing connection means of the first substrate,
and finally the formation of conducting pads in and possibly on these etched zones.

No sacrificial layer will be formed when the conducting pads can be etched selectively relative to the first substrate.

The upper electrode may be obtained by using a third substrate to make the transfer onto the first substrate. In other words, an upper electrode is then formed by transferring a third substrate comprising said second electrode, such that the conducting pads are in contact with this electrode.

The method described is capable of generating interconnections and alignment marks "self-aligned" on the lower electrodes, during the same technological steps.

Such a method may also comprise the formation of electrical contact zones between the lower electrode and the first substrate.

It may also comprise the formation of a dielectric layer between the second substrate and the lower electrode layer.

Etched zones may be defined in the lower electrode layer and in the dielectric layer arranged between the second substrate and the lower electrode layer.

As a variant, the dielectric layer may be uniform, etched zones being defined in the lower electrode layer before forming the dielectric layer.

This method may also comprise a step to thin the first substrate before step c) to make the connection means pass through. In general, this thinning step also defines the thickness of the mobile part.

Step c) is preferably made by etching patterns passing through the first substrate.

Such a method can simplify known methods, particularly the method described by Yamamoto et al. It enables the production of interconnections to restore alignment between the lower technological levels (lower electrodes) and the technological levels made on the surface on MEMS.

The result is a simpler method than that used in prior art because it comprises fewer technological steps, it does not require any specific alignment equipment and there are no added additional steps, unlike the solution proposed by Yamamoto.

DETAILED PRESENTATION OF PARTICULAR EMBODIMENTS

Figure 1:
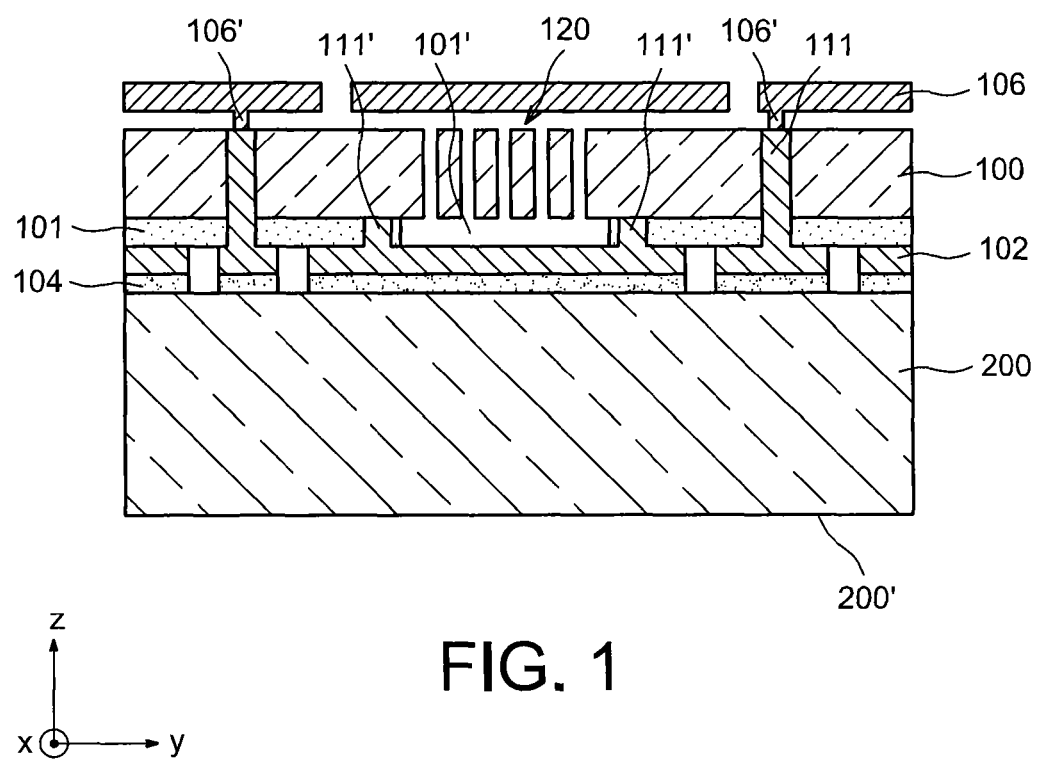
FIG. 1 shows a NEMS/MEMS structure with 2 parallel capacitive electrodes, below and above the active layer.

We will start by describing an example of a MEMS/NEMS structure shown in FIG. 1, which is a sectional view.

We will refer to "substrate" 100, 200, 300 in the following, although we could also say a "layer". Consequently, we will use either of these terms indifferently for these three elements.

The structure in FIG. 1 may be made in 2 substrates 100, 200 that are subsequently called the first substrate and the second substrate respectively, superposed and assembled to each other preferably by direct bonding or molecular bonding.

For a better understanding of the description, we will refer to a orthogonal coordinate system xyz as shown in FIG. 1, in other words with a Z axis perpendicular to the layers or substrates of the device, while the other two axes x and y are perpendicular to the Z axis and are perpendicular to each other.

The structure in FIG. 1 comprises:
a first substrate or active layer 100 in which the mobile or active part of the MEMS (or NEMS) is formed;
a support substrate or second substrate 200;
a set of lower electrodes 102 and a sacrificial layer 101 located between the first substrate and the second substrate, part of the sacrificial layer 101 being eliminated to form a cavity 101' under the mobile part of the system; the bottom of this cavity is formed partly by the upper surface of an electrode 102 that faces at least part of the active zone of the MEMS;
a set of upper electrodes 106 located at a certain distance from the active zone of the MEMS and that faces at least part of this active zone;
interconnection means 111 that electrically connect the lower electrode layer 102 and the upper electrode layer 106 through the substrate 100.

As can be seen in FIG. 1, the connections 111 are in the form of through pads, for example cylindrical section pads in the xy plane.

In the example chosen, these connections are arranged outside the mobile parts of the MEMS in the xy plane on each side of the active part 120 of the MEMS, made in the substrate 100 in the example chosen. Their number may be variable, two are shown in the figure, one on each side of the active part 120, but this number may be arbitrary (or even equal to 1).

Furthermore, one or several connections 111' can also be seen between the set of lower electrodes 102 and the substrate 100, so that the active layer can be polarised at specific locations, for example to limit parasite capacitance phenomena.

The material in the lower electrode 102 may be a semi-conducting material, preferably doped, for example doped amorphous or poly-crystalline Si, or a metallic layer.

Part of the first substrate that forms the active zone or mobile mass 120 is free to move, particularly along the Z axis. This displacement can be detected by lower electrodes 102 and upper electrodes 106.

In the example described herein, a capacitive detection system is used. In the case of an RF component, for example, there will be a resistive membrane formed in a very slightly doped Si substrate.

Figure 5:
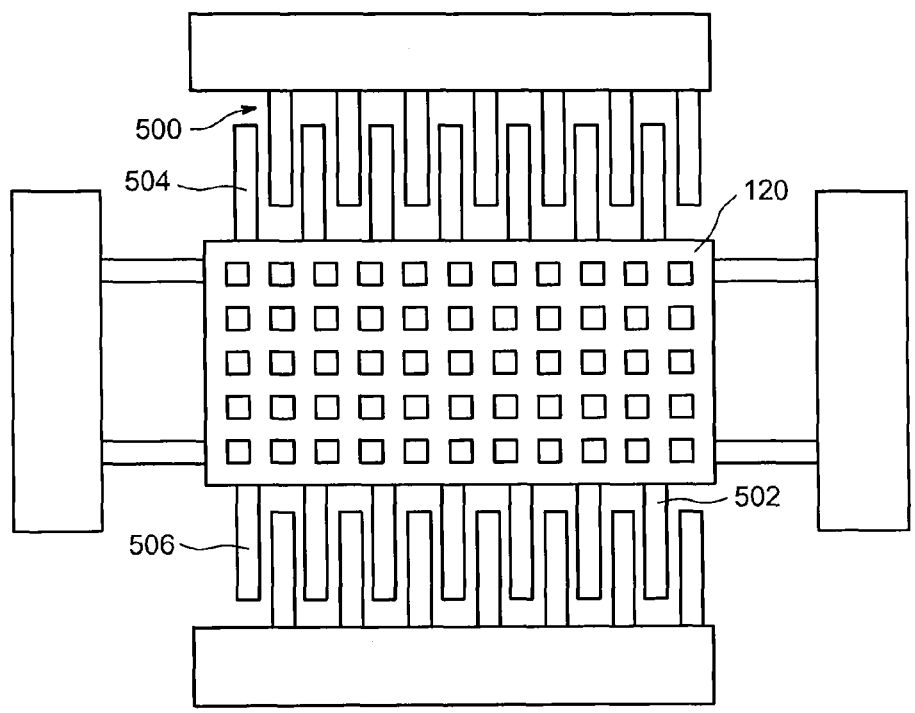
FIG. 5 shows a simplified top view of the intermediate substrate, with a mobile structure.

FIG. 5 shows a simplified top view of the substrate 100 with an example of a structure with a mobile mass 120 also comprising means of detecting movement of the mobile mass in the plane of the layer 120.

The mobile mass may comprise one or several mobile combs, free to move relative to one or several fixed combs.

The structure in this FIG. 5 shows a mobile mass 120 provided with inter-digitised electrostatic combs on its sides, some of which 500, 506 are fixed and others 504, 502 are mobile, a mobile comb 504, 506 being inter-digitised with a fixed comb 500, 502. A variation in the distance between a fixed comb and the mobile comb facing it will cause a movement of the mobile comb, which itself is due to a movement of the mobile mass 120 and therefore the device, causing a variation in the capacitance detected by means provided for this purpose.

In general, the mobile part enables detection of movements imposed on the component.

Furthermore, the mobile part may comprise one or several mobile or seismic masses.

As can be seen also in FIG. 1, the level of upper electrodes 106 is not supported directly on the substrate 100, but it is connected to the pads 111 through pads 106' that keep a given distance between the upper surface of the substrate 100 and the lower surface of the electrode layer 106.

For example, the thickness of the substrate 100 may be between a few tens of μm and a few hundred μm, for example between about 10 μm and 100 μm or 500 μm.

This substrate extends in the xy plane, the z axis being perpendicular to each of the substrates 100, 200. This is why the xy plane is also called the plane or principal plane of the device.

The thickness of the device measured along the z axis may be very small compared with the lateral extensions of the device, in other words in comparison with the dimensions p and l of the device measured in the xy plane; p (measured along the x axis) may for example be between 100 μm and a few mm and l (measured along the y axis) may for example be of the order of a few hundred micrometers, for example between 100 μm and 10000 μm.

The substrate 100 may be made from a semiconducting material, preferably monocrystalline, but also possibly poly-crystalline. For example it may be made from silicon, or SiGe or SiC or SiGeC or GaAs or Ge or a semiconducting material in group III-V. The semiconducting material (and particularly silicon) may be doped, particularly in the above example to enable electrical conduction in the active layer.

Figure 6:
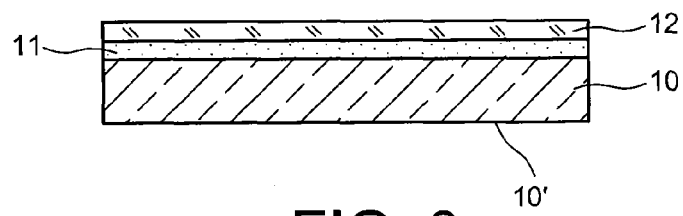
FIG. 6 shows an SOI substrate structure.

As a variant, this substrate 100 may be a "silicon on insulator" (SOI) type substrate comprising a substrate 10 made of a semiconducting material, a buried layer 11 of oxide and a thin semiconducting layer 12 for example made of monocrystalline silicon, as shown in FIG. 6. This type of substrate 100 may be used to create functions using for example the monocrystalline nature of the layer 12.

An SOI substrate may also be used advantageously in which the layer 101 and the lower electrode 102 would be entirely or partly formed by the buried oxide layer 11 and the possibly doped thin silicon layer 12 respectively. The advantage of this embodiment is particularly that the layer 11 can be used for example as an etching stop layer.

As a variant, this substrate may comprise several layers stacked on a semiconducting substrate, each layer for example being located in any of the materials mentioned above.

The advantage is that additional interconnection levels may be made and/or functions can be added under the active layer.

The substrate 200 may for example be made of Si or one of the other semiconducting materials mentioned above or a material transparent to light (for example glass or quartz, etc.) depending on the end purpose of the component. It may possibly be covered by a dielectric layer (not shown in the figure).

In the remainder of this description, the lower part or side of the device refers to the part facing the free surface 200' of the substrate 200, and the upper part or side of the device is the part facing the opposite side, namely the side of the electrodes 106.

Figure 3A:
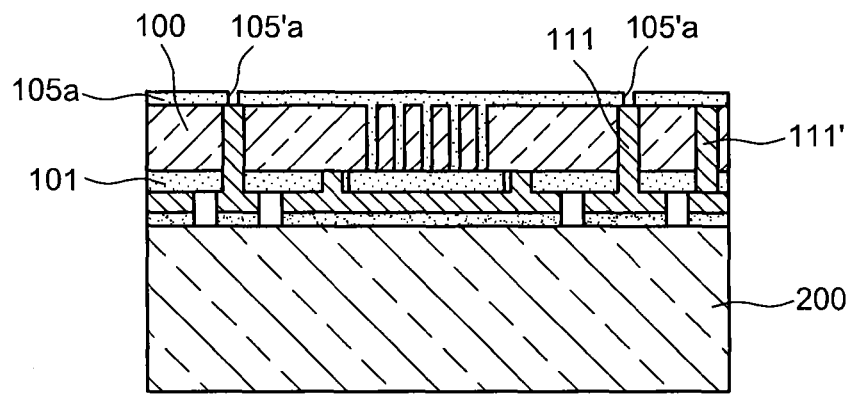
FIGS. 3A-3D show a variant of steps in performing the method in FIGS. 2A-2I, FIGS. 4A-4B show a variant of the other steps in the production of a MEMS or NEMS type device, in which the layer used for assembly with the second substrate is continuous.
Figure 3B:
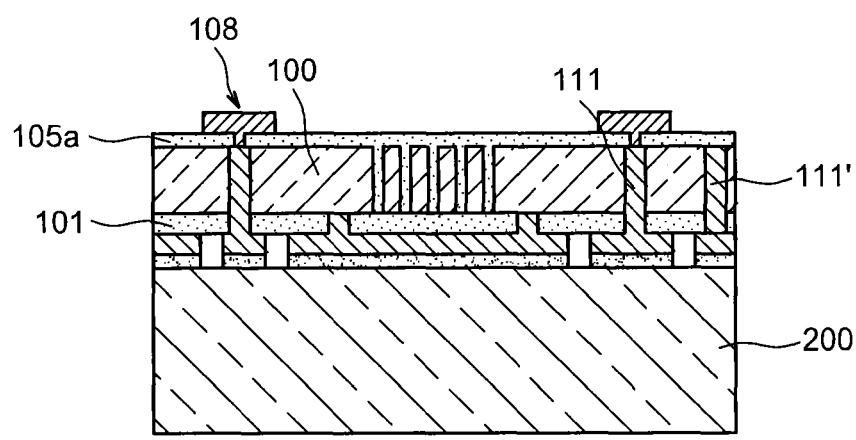
Figure 3C:
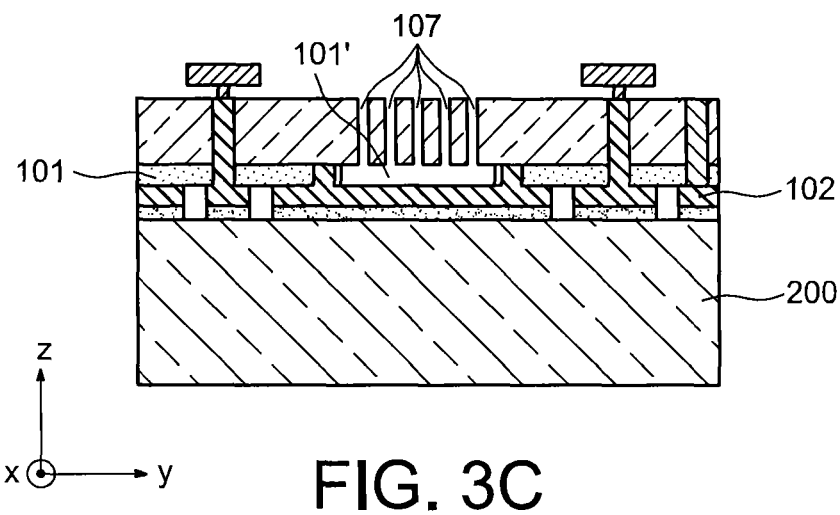
Figure 3D:
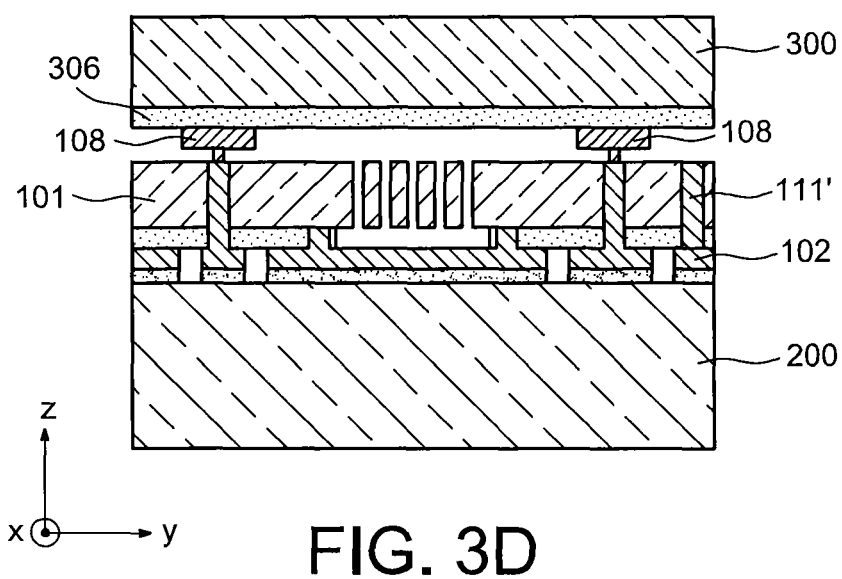

Another example of a MEMS/NEMS structure is shown in FIG. 3D, which is also a sectional view.

The difference from the previous structure lies in the way in which the upper electrode layer 306 is connected to the substrate 100. The link between the upper electrode layer and the interconnections 111 that pass through the substrate 100 is made by conducting means 108, for example in the form of connection pads 108.

The fabrication methods described below are only given as examples and may be applied to components other than the component with capacitive detection used for illustration.

FIGS. 2A-2I show a first example of a method to make a MEMS type device with capacitive detection outside the plane.

The starting point (FIG. 2A) is a substrate 100 that may be composed of one of the materials already mentioned above. This is the substrate 100 in which the active part of the MEMS will be made.

A dielectric layer 101 (FIG. 2B) called the sacrificial layer is deposited or grown on this substrate 100, using a method for example such as thermal oxidation or by a CVD deposition, or a plasma enhanced CVD deposition (PECVD), or ALD (atomic layer deposition), or IBD (Ion Beam Deposition). This insulating layer 101 isolates the future lower electrode 102 from the first substrate 100. Therefore the function of this dielectric layer is essentially an electrical insulation function but it can also be used as a sacrificial layer.

Photolithography and etching steps can then be done (FIG. 2C) to define cavities 111, 111', 111" in this first dielectric layer and for some of them, in the substrate 100. The cavities 111 can then be used to form contact means between the lower electrode and the upper electrode of the device, through the substrate 100. The cavities 111' can be used to make alignment marks (111') passing through the substrate 100, compatible with the alignment equipment. These marks are thus self-aligned with the lower electrode. The cavities 111" are used to make contact zones between the substrate 100 and the lower electrode 102.

These cavities 111, 111' and 111" can be etched in one or several steps to a depth greater than the thickness of the future MEMS component, typically of the order of 5 μm to 100 μm or 200 μm, for example, for a component said to have a high aspect ratio. In other words, the depth of the cavities 111, 111' is greater than or equal to the thickness of the substrate 100 after thinning, as described below.

Figure 2A:
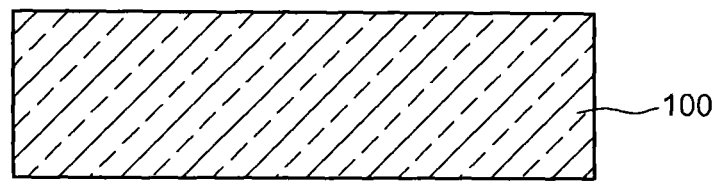
FIGS. 2A-2I show various steps in the production of a MEMS or NEMS type device, in which the layer used for assembly with the second substrate comprises cavities.
Figure 2B:
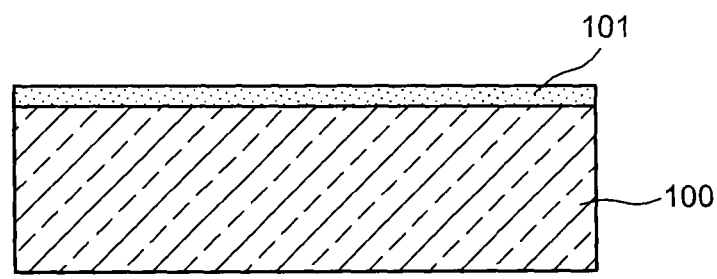
Figure 2C:
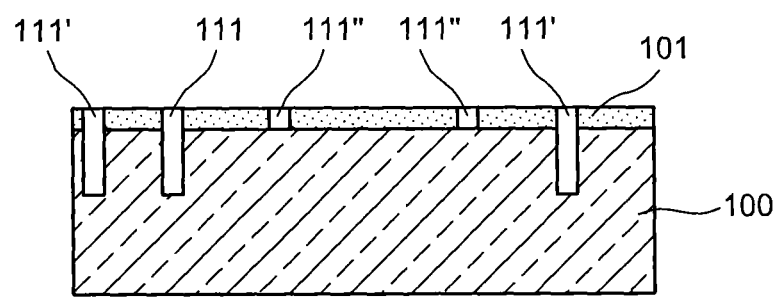
Figure 2D:
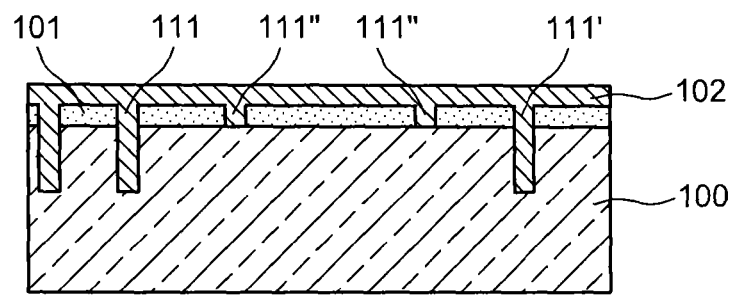

The cavities are then filled with a conducting material 102 (FIG. 2D). The conducting layer 102 formed on the upper surface of the substrate 100 and that will be called the lower electrode or the lower electrode layer depending on the geometry of the electrodes made in this layer 102, is created during this step, thus enabling a very good quality contact between the conducting cavity and the lower electrode. The cavities 111' used for alignment marks are filled at the same time as the interconnections.

The method of depositing this conducting layer of the lower electrode will be chosen as a function of its nature: for example this deposition can be made by evaporation or by CVD or by plasma enhanced CVD, or by sputtering. Deposition of a layer of doped Si by LPCVD is attractive because it is compatible with most methods used in a semiconductor production line, which allows the designer of this type of MEMS a great deal of freedom in choosing technological steps for complete fabrication of the component.

The cavities 111, 111' may be isolated before filling with the conducting material. This isolation may be done by formation of a coating or a thin dielectric layer on the surfaces of each cavity 111, 111', for example by thermal oxidation or by a deposition method such as CVD or plasma enhanced CVD (PECVD), ALD or IBD.

Finally, the lower electrode 102 may be thinned, for example by physical or chemical etching or by mechanical-chemical polishing or by a combination of these methods.

Figure 2E:
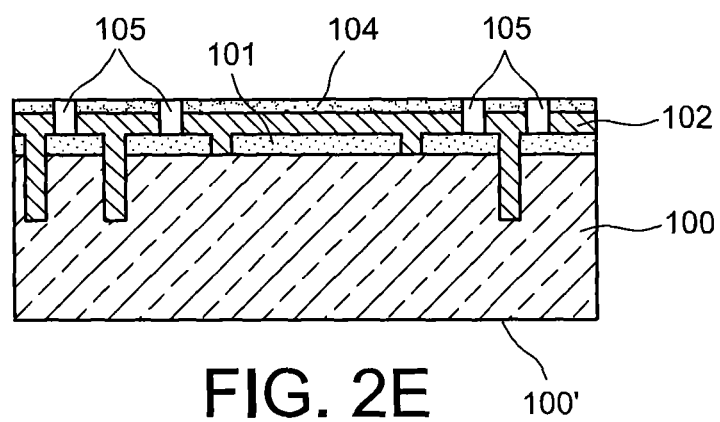

FIG. 2E shows the formation of a dielectric layer 104 above the lower electrode. This layer may be made by thermal oxidation or by a deposition such as a CVD deposition or plasma enhanced CVD (PECVD), or ALD or IBD, for example. This dielectric layer and the conducting layer 102 on which it is formed can then be etched to define the structure of the lower electrode as can be seen in FIG. 2E with the etched zones 105. The bottom of the etched zones is approximately equivalent to the surface of the layer 101.

In the case of an SOI type substrate (FIG. 6), the surface layer 12 can form the membrane on which all or some of a micro or nano system is formed. The dielectric 11 of the SOI may then be used as a stop layer for etching the vias.

Figure 2F:
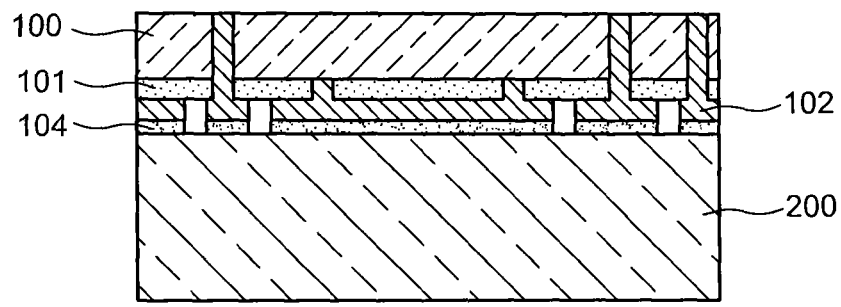
Figure 2G:
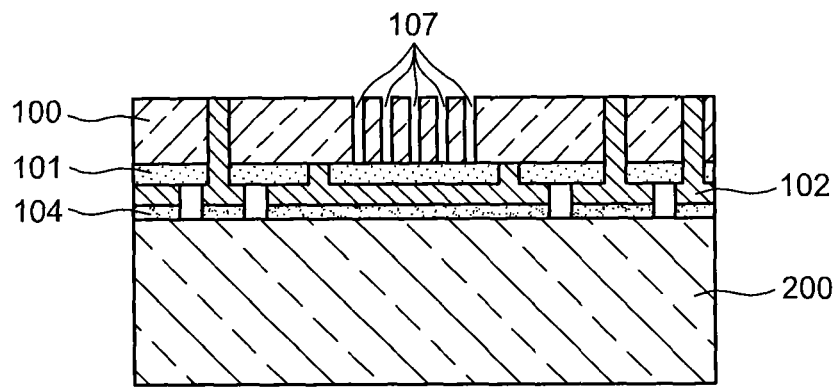

An assembly can then be made by cementing this substrate 100 thus prepared with the second substrate 200, preferably in direct bonding (FIG. 2F). The surface of the dielectric layer 104 then comes into contact with the substrate 200, a layer of insulating or dielectric material being formed on this substrate 200; the assembly is then made with this dielectric layer.

The first substrate 100, once assembled to the second substrate, is thinned (FIG. 2F) from its face 100' opposite the interface between the two substrates 100, 200. This step thus defines the thickness of the MEMS/NEMS and exposes the interconnections 111 and exposes the alignment marks 111'.

This thinning may be done alone or in combination, using one or several of the following techniques: chemical etching and/or dry etching and/or ionic implantation and separation of the substrate (for example see document EP 763849) and/or grinding, and/or mechanical-chemical polishing.

After being thinned, the first substrate 100, is etched vertically (FIG. 2G) from its upper face opposite the interface between the two substrates 100, 200. This means that vertical etched zones 107 can be formed that pass through the substrate 100 and define the mobile parts of the active zone 120 of the device. The bottom of the etched zones corresponds approximately to the surface of the layer 101.

This thus defines the active part of the MEMS.

The etching used may be of the RIE type and preferably the DRIE type.

The process can be stopped at this stage, in which case no upper electrode and no assembly with a substrate or cap 300 will be made (FIG. 3D), and therefore there will be no second electrode. If a lower electrode and an upper electrode enable detection of the movement of the mobile part outside the plane of the layers by capacitive variation, a single electrode may be sufficient for this detection although the use of a second electrode enables detection with better sensitivity.

But on the contrary, it is also possible to continue the manufacturing method with the formation of an upper electrode.

Figure 2H:
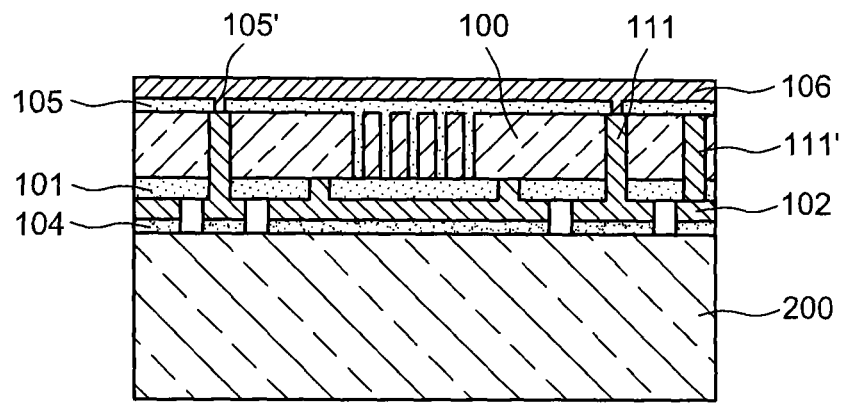

This can then be made above the active layer (FIG. 2H).

This is why an oxide layer 105 is formed on the upper surface of the substrate 100; the material in this layer fills in or blocks off the cavities 107 left open during etching of the MEMS structure.

Openings 105' are made in the layer 105 above the top of the interconnections 111 in order to prepare the electrical connection between the upper electrode and these interconnections 111. A layer of conducting material 106 can then be deposited on the layer 105. The thickness of the layer 105 defines the distance between the upper part of the active part of the MEMS and the lower surface of the electrodes 106.

This conducting layer 106 is then partially etched in order to form through zones 106". The structure of the upper electrodes 106 is thus defined. The MEMS can also be released through the openings 106" by elimination by wet, dry or vapour phase etching of the sacrificial layer 105. The electrodes 106 then remain in contact only with the interconnections 111 through the parts of the conducting material that were formed in the etched zones 105' of the layer 105.

The dielectric material present in the crossings 107 is also etched together with the portion of the layer 101 on which the active part of the MEMS is supported, thus forming a cavity 101' between the active part and the lower layer of electrodes 102.

Figure 2I:
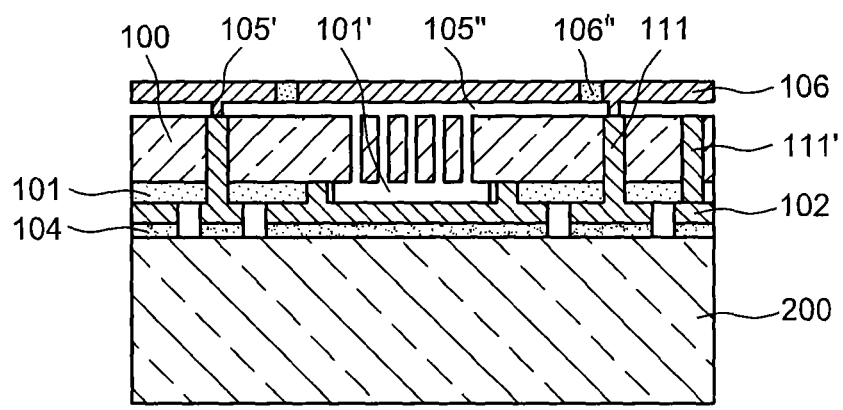

The result obtained is then the structure shown in FIG. 2I, the active part of the MEMS being free between the two etched zones 101' and 105".

FIGS. 3A to 3C show another example of the formation of the upper electrode 106a facing the active layer.

Starting from the structure obtained during the step described above with reference to FIG. 2F, an oxide layer 105a is formed on the upper surface of the MEMS (FIG. 3A).

Openings 105'a are formed in this layer 105a in order to prepare the electrical connection between the upper electrode and the interconnections 111. Therefore, openings 105'a are made above these connection pads 111.

A deposition of conducting (or semiconducting) material, for example made of Ge, is then formed on the insulating layer and in openings 105'a, and then etched to define contact pads 108 that project above the free surface of the layer 105a (FIG. 3B). The height of these pads and the thickness of the layer 105a can define the distance that will separate the upper part of the substrate 100 and therefore the active zone of the MEMS, and the lower surface of the future electrode 106.

The layer 105a and then the substrate 100 are then etched vertically (FIG. 3C) from the upper face, opposite the interface between the two substrates 100, 200. This etching step can form vertical etched zones 107 that pass through the substrate 100, but also the portion of the layer 101 located between the lower electrode 102 and the active zone of the MEMS. It leaves the connection means that were formed intact, and particularly the contact pads 108. Etching of the layer 101 leads to the formation of a cavity 101' that exposes the active zone. The bottom of this cavity 101' is approximately at the surface of the electrode layer 102. The active part of the MEMS is thus defined. Etching of the layer 100 may be of the RIE type, and preferably DRIE.

The upper electrode may then be made above the active layer (FIG. 3D).

The next step to achieve this is to assemble a substrate 300 provided with a conducting layer 301 on its surface that may have been previously etched and that will form the future upper electrode layer. This conducting layer is assembled with the free ends of the pads 108. The assembly is made by metallic cementing onto the contact pads.

A cap 300 without an electrode 301 may also be advantageous in the case of a component operating with the single lower electrode.

A variant of the steps described above in relation with FIGS. 2E-2F will now be described.

Figure 4A:
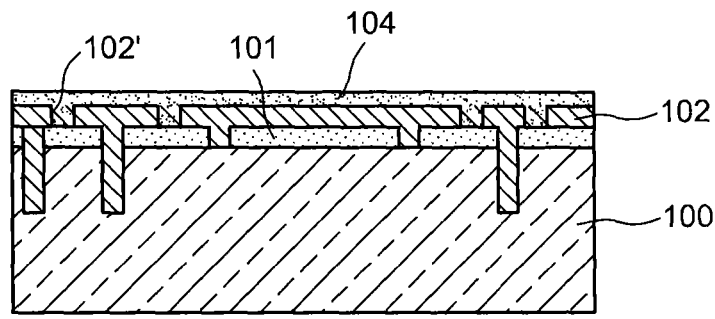

The electrode layer 102 is etched in zones 102' starting from the structure obtained at the end of the step described above with reference to FIG. 2D (FIG. 4A). The bottom of these etched zones is approximately the same as the upper surface of the layer 101. An insulating layer 104, for example an oxide layer, is formed on the upper surface of the layer 102. The material in this insulating layer 104 also fills the zones 102' that were previously etched. The layer 104 may be formed by one of the techniques already mentioned above.

Figure 4B:
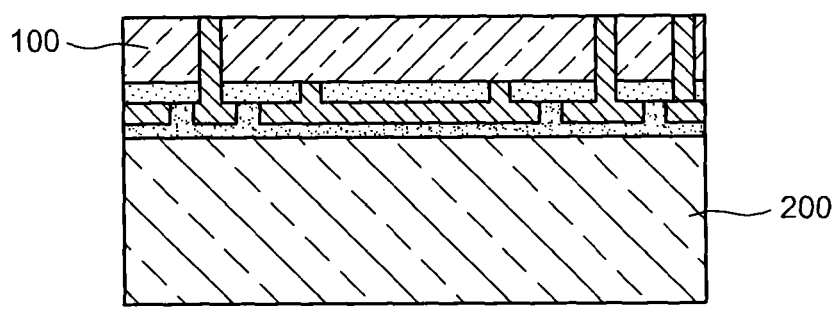

The next step is to make an assembly by cementing this substrate 100 thus prepared with a second substrate 200, preferably by direct bonding (FIG. 4B). The surface of the dielectric layer 104 then comes into contact with the substrate 200; an insulating or dielectric layer may possibly be formed on this substrate 200, the assembly then being made with this dielectric layer.

In this variant, the layer 104 remains continuous and is not etched. The electrode 102 is etched before this layer 104 is deposited, unlike the step in FIG. 2E in which the layer 104 is deposited first before making the etched zones 105, both in this layer and in the electrodes layer 102.

Once assembled to the substrate 200, the substrate 100 may be etched along a vertical direction as explained above with reference to FIG. 2G. The next step is to perform the steps corresponding to FIGS. 2H-2I. Refer to the above description of these steps.

The invention claimed is:

1. At least one of a microsystem or a nanosystem device comprising:
   a first substrate, being an intermediate substrate, comprising a mobile part,
   a second substrate being a support substrate,
   at least one first electrode, being a lower electrode, formed of at least one conducting material, defined in a lower electrode layer, and one dielectric layer located between the first and second substrates, the dielectric layer being arranged in part or in whole between the lower electrode and the first substrate, a cavity disposed under the mobile part of the system, said lower electrode disposed under said cavity and having a top part facing at least part of the mobile part spaced apart from the mobile part, the first substrate comprising at least one through via filled with said at least one conducting material, said at least one through via and said lower electrode, both formed during a continuous process filling the at least one through via and forming the lower electrode, thereby both comprising identically the same said at least one conducting material throughout without interruption, and a bottom surface of the mobile part of the first substrate is exposed to the cavity.

2. The device according to claim 1, further comprising a second electrode, being an upper electrode, located on the first substrate, and in electrical contact with the at least one through via passing through the first substrate.

3. The device according to claim 2, the upper electrode being located on the intermediate substrate using conductors, or being supported by a third substrate.

4. The device according to claim 1, also comprising electrical contact zones between the lower electrode and the first substrate.

5. The device according to claim 1, the first substrate being made of a semiconducting material, for example silicon, or SiGe or SiC or SiGeC or GaAs or Ge or a semiconducting material in Group III-V, preferably doped, or a "silicon on insulator" (SOI) type substrate.

6. The device according to claim 1, the first substrate comprising several layers stacked on a substrate.

7. The device according to claim 1, further comprising a dielectric layer between the second substrate and the lower electrode layer.

8. The device according to claim 7, etched zones being defined in the lower electrode layer and in the dielectric layer located between the second substrate and the lower electrode layer.

9. The device according to claim 7, etched zones being defined in the lower electrode layer, said etched zones being filled with the material of said dielectric layer.

10. The device according to claim 1, wherein the cavity is at least as wide as the mobile part.

11. The device according to claim 1, wherein the cavity is wider than a width of the mobile part.

12. The device according to claim 1, wherein the first substrate comprising said at least one through via is filled with said at least one conducting material.

13. The device according to claim 1, wherein an extension member contacts specific locations of the first substrate to limit parasite capacitance.

14. The device according to claim 1, wherein an extension member of the lower electrode contacts specific locations of the first substrate.

15. The device according to claim 1, wherein an extension member contacts specific locations of the first substrate.

16. The device according to claim 15, wherein the extension member limits parasite capacitance.

* * * * *